(12) United States Patent
Robert et al.

(10) Patent No.: US 7,310,029 B2
(45) Date of Patent: Dec. 18, 2007

(54) BULK ACOUSTIC RESONATOR WITH MATCHED RESONANCE FREQUENCY AND FABRICATION PROCESS

(75) Inventors: Philippe Robert, Grenoble (FR); Pascal Ancey, Revel (FR); Grégory Caruyer, Goncelin (FR)

(73) Assignees: Commissariat a l'energie Atomique, Paris (FR); ST Microelectronics SA, Montrouge (FR)

( * ) Notice: Subject to any disclaimer, the term of this patent is extended or adjusted under 35 U.S.C. 154(b) by 654 days.

(21) Appl. No.: 10/883,690

(22) Filed: Jul. 6, 2004

(65) Prior Publication Data

US 2005/0028336 A1    Feb. 10, 2005

(30) Foreign Application Priority Data

Jul. 17, 2003    (FR) ................... 03 08715

(51) Int. Cl.
*H03H 9/15* (2006.01)
*H03H 9/54* (2006.01)

(52) U.S. Cl. ....................... 333/188; 310/312
(58) Field of Classification Search ............... 333/188; 310/312
See application file for complete search history.

(56) References Cited

U.S. PATENT DOCUMENTS

| | | | | |
|---|---|---|---|---|
| 5,587,620 A | | 12/1996 | Ruby et al. | |
| 5,780,713 A | * | 7/1998 | Ruby | 73/1.82 |
| 6,131,256 A | * | 10/2000 | Dydyk et al. | 29/25.35 |
| 6,339,276 B1 | | 1/2002 | Barber et al. | |
| 6,707,351 B2 | * | 3/2004 | Gorrell | 333/188 |
| 7,194,247 B2 | * | 3/2007 | Tikka et al. | 455/339 |

FOREIGN PATENT DOCUMENTS

| | | |
|---|---|---|
| GB | 2649878 | 6/1927 |
| GB | 971571 | 9/1964 |
| JP | A 63-151103 | 6/1988 |
| WO | WO 84/00082 | 1/1984 |

* cited by examiner

*Primary Examiner*—Barbara Summons
(74) *Attorney, Agent, or Firm*—Oliff & Berridge PLC

(57) ABSTRACT

The resonator comprises a piezoelectric layer arranged between two electrodes. An electrical heating resistor is arranged in thermal contact with at least one of the electrodes. Temporary heating of the electrode enables the material constituting the electrode to be partially evaporated, so as to thin the electrode and thus adjust the resonance frequency. Measurement of the resonance frequency in the course of evaporation enables the heating to be interrupted when the required resonance frequency is obtained. One of the electrodes can be arranged on a substrate formed by an acoustic Bragg grating. The resonator can comprise a substrate comprising a cavity whereon one of the electrodes is at least partially arranged.

6 Claims, 3 Drawing Sheets

BULK ACOUSTIC RESONATOR WITH MATCHED RESONANCE FREQUENCY AND FABRICATION PROCESS

BACKGROUND OF THE INVENTION

The invention relates to a bulk acoustic resonator having at least one resonance frequency and comprising a piezoelectric layer arranged between two electrodes.

STATE OF THE ART

In a transmission-receipt channel, for example for mobile communication, several radiofrequency filtering levels are required: on antenna output, as rejection filter, etc . . . Three main techniques are currently used to achieve radiofrequency filters:
  RLC type circuits, that are integratable, but whose characteristics are mediocre on account of the performances of each of the components, in particular of the inductance, the quality factor of an integrated inductance hardly exceeding 30.
  Ceramic filters, that are not integratable.
  Surface acoustic wave ("SAW") components, that are not integratable.
In SAW type components, a surface acoustic wave is excited in a piezoelectric material by a first electrode grating in the form of a comb. A second electrode grating in the form of a comb is intercalated in the first network and detects the surface wave to supply the output voltage of the filter. The width, pitch and number of fingers of the combs determine a resonance frequency or a passband of the filter. The surface area of these components, typically several mm$^2$, and the materials used make them unsuitable for integration on integrated circuits. Moreover, SAW type filters are limited in frequency to a range comprised between 100 MHz and about 2.5 GHz.

Another direction for research arises, based on the use of bulk acoustic wave ("BAW") resonators. These resonators can be integrated and offer high quality factors (>1000). A bulk acoustic wave is excited in a thin piezoelectric layer comprised between two electrodes. Filters achieved using BAW type resonators generally comprise several coupled resonators. The resonance frequencies of the individual resonators determine the central frequency of the filter. Its passband depends on the coupling characteristics, for example on the position and the rigidity, whereas the number of resonators gives the order of the filter. This type of resonator enables filters to be achieved in a range comprised between 300 MHz and about 10 GHz.

Two types of bulk acoustic wave resonators can be distinguished:
  Thin Film Bulk Acoustic Resonators ("FBAR"), represented in FIGS. 1 and 2, where the stack constituted by the two electrodes 1 and 2 and the piezoelectric layer 3 is separated from a substrate 4 by a cavity 5 enabling dissipation of the acoustic waves to be reduced. The cavity 5 is achieved either by etching of the substrate 4 (FIG. 1) or by suspending said stack (FIG. 2) by the use of a sacrificial layer when fabrication takes place.
  Solidly Mounted Resonators ("SMR"), in which the stack constituted by the two electrodes 1 and 2 and the piezoelectric layer 3 is arranged on an acoustic Bragg grating 6 designed to reflect the acoustic wave (FIG. 3). An acoustic Bragg grating is formed by a stack of layers, 7, 7' and 7" in FIG. 3, made from different materials presenting very different acoustic impedances, the thickness of each layer 7, 7' and 7" corresponding approximately to a quarter of the acoustic wavelength.

For these two types of bulk acoustic resonators, the resonance frequency is inversely proportional to the thickness of the piezoelectric layer 3. In the case of an aluminum nitride piezoelectric layer, for example, a frequency of 2 GHz is obtained for a thickness of about 1.8 μm.

In radiofrequency applications, resonance frequencies of about a GHz are conventionally sought for, corresponding to piezoelectric layer thicknesses of about a micron. Monitoring the frequency to within ten MHz corresponds to monitoring the thickness of the piezoelectric layer to within about 10 nm, i.e. about 1% of the total thickness, which from an industrial point of view is hardly envisageable. The thickness errors of the electrodes and of the piezoelectric layer then induce a resonance frequency error. Consequently, resonance frequency adjustment methods are used, during or after fabrication of the component. However, known adjustment methods impair the performances of the final component and/or make its fabrication complicated. Indeed, to modify the resonance frequency after fabrication of the component, it is possible to associate thereto a variable capacitor type diode in series. Changing the value of the variable capacitor of the diode modifies the resonance frequency of the assembly. However, the quality factor of variable capacitor type diodes is very low in comparison with the quality factors of BAW type resonators and thus considerably reduces the quality factor of the assembly.

Other resonance frequency adjustment methods are based on successive depositions or etchings and intermediate resonance frequency measurements. These methods are generally heavy and costly.

In the document U.S. Pat. No. 5,873,153, a fusible conducting material is arranged in a cavity of an FBAR type resonator. Flow of a current causes evaporation of the fusible material, which deposits on the walls of the cavity. In a first approach, the fusible material is initially deposited on the substrate and deposits, after evaporation, forming a layer on the electrode arranged on the cavity. This method, in addition to the conventional resonator fabrication steps, requires a plate comprising the fusible material to be positioned and aligned under each component. The evaporated material may generate stresses and impair the performances of the resonator. In addition, the layer of evaporated material may modify the acoustic properties by addition of an interface. In a second approach, the fusible material is initially arranged in the form of a layer on the electrode and deposits, after evaporation, on the walls of the cavity belonging to the substrate. The non-evaporated fusible material may modify the acoustic properties by addition of the interface between this material and the electrode. The two approaches are suitable for FBAR type resonators but are not applicable for SMR type resonators. Furthermore, frequency adjustment is performed by means of an additional layer on the electrode in which the acoustic energy density is fairly low. The effect of a modification of this additional layer is consequently small with respect to the influence of the thickness of the piezoelectric layer or of the electrodes.

OBJECT OF THE INVENTION

The object of the invention is to remedy these drawbacks and, in particular, to achieve a bulk acoustic resonator having a predetermined resonance frequency, while simplifying the fabrication process.

According to the invention, this object is achieved by the fact that the resonator comprises heating means arranged in thermal contact with at least one of the electrodes and enabling the material constituting the electrode to be partially evaporated by temporary heating of the electrode.

According to a preferred embodiment, the heating means comprise at least one electrical resistor.

According to a development of the invention, the resonator comprises an electrically insulating layer on an external face of at least one of the electrodes, the electrical resistor being arranged on the external face of the insulating layer.

According to another development of the invention, the electrical resistor is integrated in the electrode.

According to an alternative embodiment, the external face of one of the electrodes is arranged on a front face of a substrate formed by an acoustic Bragg grating, the heating means being in thermal contact with the other electrode.

According to another alternative embodiment, the resonator comprises a substrate comprising a cavity whereon one of the electrodes is at least partially arranged.

An object of the invention is also to achieve a process comprising
  deposition of a first electrode on a substrate,
  deposition of the piezoelectric layer on the first electrode,
  deposition of a second electrode on the piezoelectric layer,
  achievement of the heating means, arranged in thermal contact with at least one of the electrodes,
  operation of the heating means during a set period so as to thin the electrode by evaporation of the material constituting the latter and to thus adjust the resonance frequency.

According to a development of the invention, the process comprises measurement of the resonance frequency in the course of evaporation of the electrode material, and interruption of operation of the heating means when the required resonance frequency is obtained.

BRIEF DESCRIPTION OF THE DRAWINGS

Other advantages and features will become more clearly apparent from the following description of particular embodiments of the invention, given as non-restrictive examples only and represented in the accompanying drawings, in which.

DESCRIPTION OF PARTICULAR EMBODIMENTS

Figure 1:
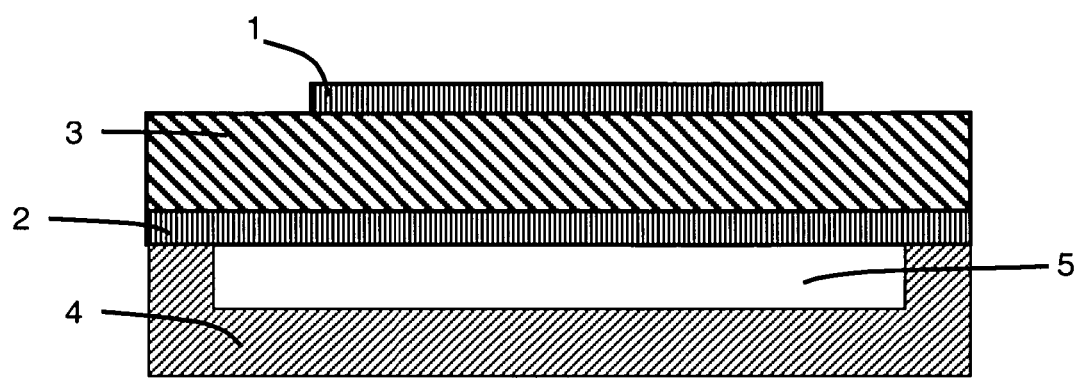
FIGS. 1 to 3 represent bulk acoustic resonators according to the prior art.
Figure 2:
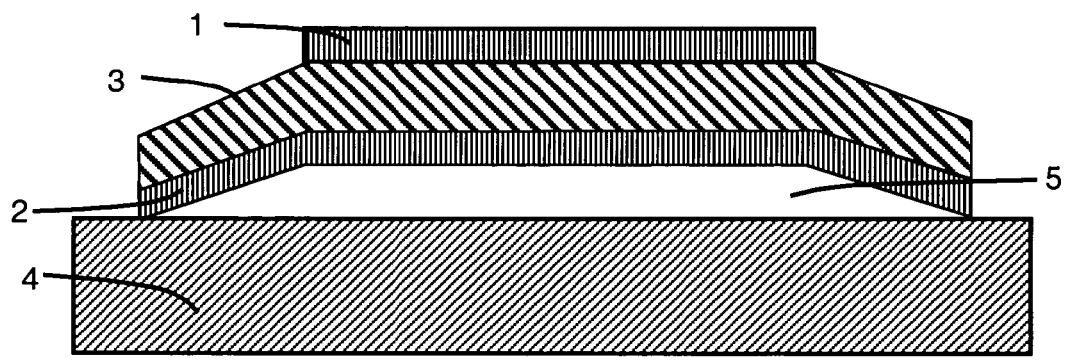
Figure 3:
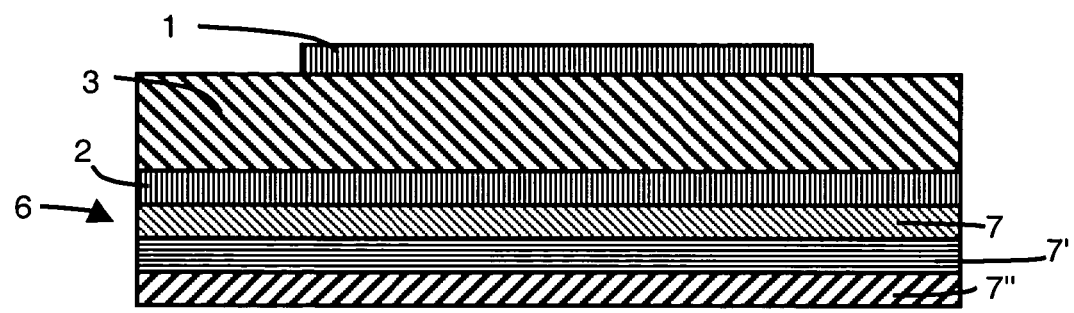
Figure 4:
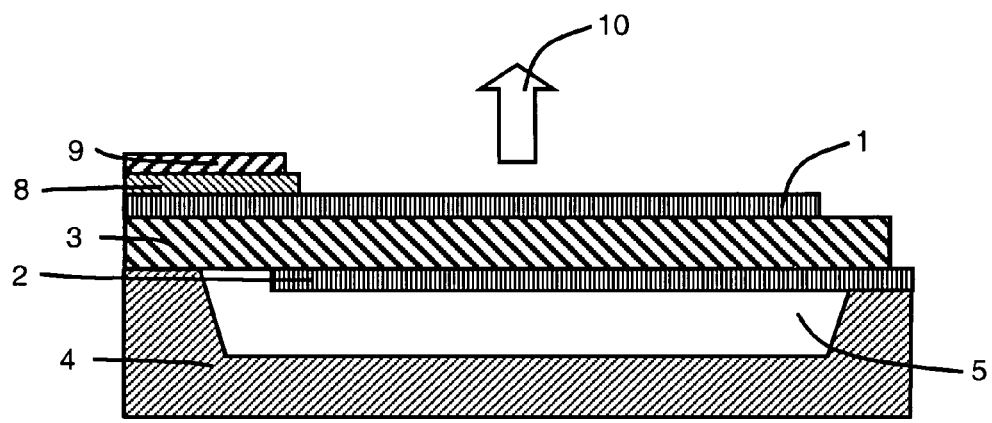
FIGS. 4 and 5 represent a particular embodiment of a resonator of the FBAR type according to the invention, respectively in cross-section and in top view.
Figure 5:
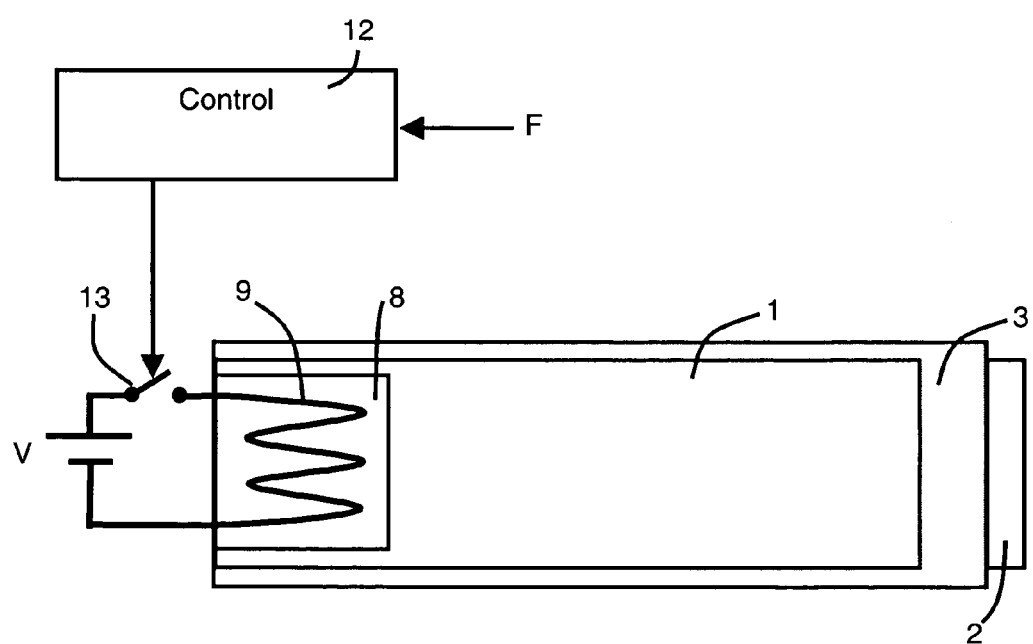

The bulk acoustic resonator represented in FIGS. 4 and 5 comprises a piezo-electric layer 3 arranged between two flat electrodes 1 and 2. The assembly formed by the piezoelectric layer 3 and the two electrodes 1 and 2 is arranged on a substrate 4 comprising a cavity 5 whereon one of the electrodes 2 is arranged. An electrically insulating layer 8 is arranged on the external face of the other electrode 1. An electrical heating resistor 9 of about a few hundred ohms is arranged on the insulating layer 8. The insulating layer 8 is sufficiently thin to enable thermal contact between the electrode 1 and the electrical resistor 9. A control circuit 12 controlling a switch 13, arranged in series with the resistor, enables an electrical voltage V to be temporarily applied to the terminals of the electrical resistor 9 (FIG. 5). The corresponding electrode 1 is thus heated, causing partial evaporation (schematized by the arrow 10) of the material constituting the electrode 1 (FIG. 4) and, thereby, thinning of the electrode 1. The electrode 2 is also thinned, in a smaller proportion than the electrode 1, by thermal conduction via the piezoelectric layer 3.

As the resonance frequency F of the bulk acoustic resonator depends on the thickness of the electrodes 1 and 2, thinning corresponds to a modification of the resonance frequency. Thus, the resonance frequency F can be adjusted in controlled manner by progressively evaporating a part of the material constituting the electrode 1 and/or electrode 2. In a preferred embodiment, the resonance frequency F, measured by any suitable common means, is supplied to the control circuit 12 and operation of the electrical heating resistor 9 is interrupted (opening of the switch 13) when the required resonance frequency is obtained.

The initial thickness of the electrode to be thinned is sufficiently large, for example about 0.2 µm, to enable a resonance frequency error corresponding to the thickness variations of the electrodes and of the piezoelectric layer due to fabrication to be compensated.

In the case of an FBAR type resonator, the electrode arranged on the cavity can also be thinned, by means of a corresponding heating resistor, unless the resonator comprises a dielectric membrane arranged between the substrate and the corresponding electrode.

Figure 6:
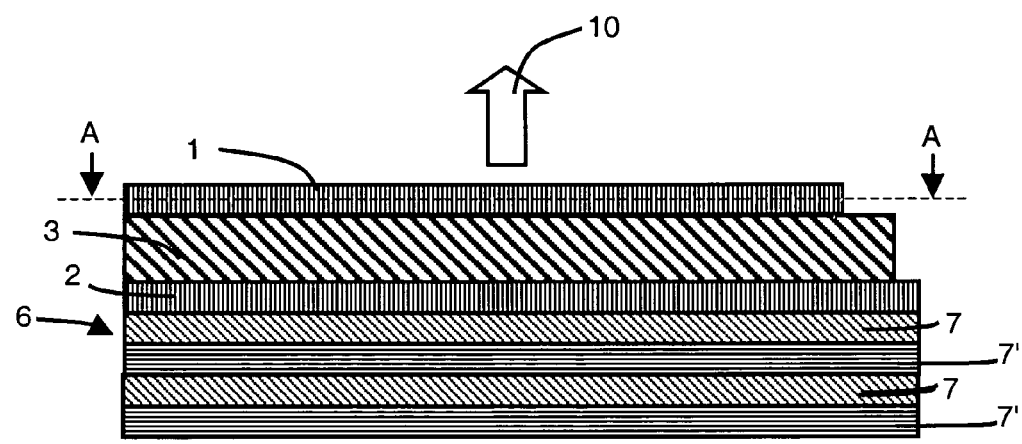
FIGS. 6 and 7 represent a particular embodiment of a resonator of the SMR type according to the invention, respectively in cross-section and in top view.
Figure 7:
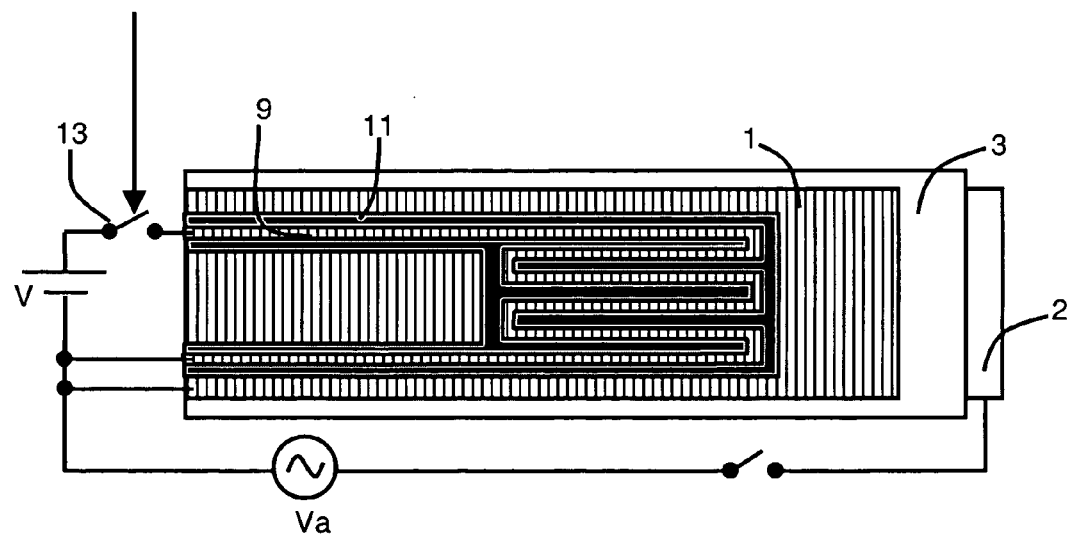

In FIGS. 6 and 7, the external face of a first electrode 2 is arranged on a substrate formed by an acoustic Bragg grating 6. The Bragg grating 6 is composed of a stack of layers, alternately 7 and 7', of materials presenting very different acoustic impedances. The first electrode 2 being enclosed between the Bragg grating 6 and the piezoelectric layer 3, it cannot be evaporated. Thus, in a resonator of this type, the electrical heating resistor 9 can only be arranged in thermal contact with the second electrode 1.

In the particular embodiment represented in FIGS. 6 and 7, the electrical heating resistor 9 is integrated in the second electrode 1. As represented in FIG. 7, an electrically insulating layer 11 is integrated in the second electrode 1, so as to confine the electrical heating resistor 9 in the material of the electrode 1. As represented in FIG. 7, during generation of acoustic waves in the resonator, a terminal of an alternating voltage source Va, applied between the first and second electrodes (2 and 1), can also be connected to the electrical heating resistor 9, which thus forms a part of the electrode 1.

The electrical heating resistor 9 preferably forms a coil. The coil is dimensioned (length, width, number of spirals) according to the resistivity of the material used and its thickness, so as to obtain a heating resistance of a few hundred ohms. The coil may cover the whole of the surface of the electrode 1. In this case, the electrical resistor 9 itself constitutes the electrode 1.

According to a particular embodiment of a fabrication process of a resonator, a first electrode 2 is deposited on a substrate, for example on a substrate formed by an acoustic Bragg grating 6, as represented in FIG. 6, or on a substrate 4 comprising a cavity 5 (FIG. 4) filled with a sacrificial layer. Then the piezoelectric layer 3 is deposited on the first electrode 2 and the second electrode 1 is then deposited on the piezoelectric layer 3 (FIGS. 4 and 6). The materials typically used are aluminum nitride or zinc oxide for the piezoelectric layer 3 and aluminum, molybdenum or platinum for the electrodes 1 and 2. The depth of a cavity 5 in the front face of the substrate 4 is typically about 0.5 μm. The thickness of the electrodes 1 and 2 is about 0.2 μm. Then, the electrical heating resistor 9 is achieved, for example by etching a groove in the form of a coil in the second electrode 1 and by depositing the electrically insulating layer 11 (FIG. 7) in this groove. In order to partially evaporate the material of the second electrode 1, an electrical voltage V, of about 5V, is temporarily applied to the electrical resistor 9. Thus, the electrode 1 is thinned by evaporation 10 (FIG. 6) of the material constituting it, preferably in a vacuum, which enables the resonance frequency F to be adjusted.

As previously, the resonance frequency F can be measured in the course of evaporation 10 of the material of the electrode 1, so as to interrupt operation of the electrical heating resistor 9 when the required resonance frequency is obtained.

The invention is applicable both to FBAR type resonators and to SMR type resonators and is not limited to the embodiments represented. In particular, several electrical heating resistors can be used.

Achievement of the resonator is compatible with integrated circuit fabrication technologies. Adjustment of the frequency can be automated by a control circuit integrated with the resonator on a single chip.

The invention claimed is:

1. Bulk acoustic resonator having at least one resonance frequency, comprising a piezoelectric layer arranged between two electrodes, the resonator comprising heating means arranged in thermal contact with at least one of the electrodes and enabling the material constituting the electrode to be partially evaporated by temporary heating of the electrode, wherein the heating means comprise at least one electrical resistor; and an electrically insulating layer on an external face of at least one of the electrodes, the electrical resistor being arranged on the external face of the electrically insulating layer.

2. Resonator according to claim 1, wherein the external face of one of the electrodes is arranged on a substrate formed by an acoustic Bragg grating, the heating means being in thermal contact with the other electrode.

3. Resonator according to claim 1, comprising a substrate comprising a cavity whereon one of the electrodes is at least partially arranged.

4. Bulk acoustic resonator having at least one resonance frequency, comprising a piezoelectric layer arranged between two electrodes, resonator comprising heating means arranged in thermal contact with at least one of the electrodes and enabling the material constituting the electrode to be partially evaporated by temporary heating of the electrode, wherein the heating means comprise at least one electrical resistor; and wherein the electrical resistor is integrated in the electrode.

5. Resonator according to claim 4, wherein the external face of one of the electrodes is arranged on a substrate formed by an acoustic Bragg grating, the heating means being in thermal contact with the other electrode.

6. Resonator according to claim 4, comprising a substrate comprising a cavity whereon one of the electrodes is at least partially arranged.

* * * * *